United States Patent [19]
Ito

[11] Patent Number: 5,488,542
[45] Date of Patent: Jan. 30, 1996

[54] MCM MANUFACTURED BY USING THIN FILM MULTILEVEL INTERCONNECTION TECHNIQUE

[75] Inventor: Kenji Ito, Tokyo, Japan

[73] Assignee: Kabushiki Kaisha Toshiba, Kawasaki, Japan

[21] Appl. No.: 291,859

[22] Filed: Aug. 17, 1994

[30] Foreign Application Priority Data

Aug. 18, 1993 [JP] Japan .................................. 5-203808

[51] Int. Cl.$^6$ .................................................. H05K 1/11
[52] U.S. Cl. ........................ 361/793; 361/767; 361/807; 361/810; 361/812; 174/52.4; 174/259; 257/700
[58] Field of Search .................................. 361/793, 767, 361/807, 808, 809, 810, 812; 174/52.4, 259; 257/758, 700

[56] References Cited

U.S. PATENT DOCUMENTS

| | | |
|---|---|---|
| 4,692,839 | 9/1987 | Lee et al. . |
| 5,241,456 | 8/1993 | Marcinkiewicz et al. .............. 361/792 |
| 5,375,042 | 12/1994 | Arima et al. ............................. 361/784 |

OTHER PUBLICATIONS

"Concurrent Engineering Realization Through Multichip Module Vehicles: Technology and CAD Tool Requirements", Wyatt, K. W., IEEE/CHMT '91 IEMT Symposium, pp. 348–355, 1991.

"Microcarrier for LSI Chip Used in the HITAC M-880 Processor Group", Inoue et al., IEEE Transactions on Components, Hybrids, and Manufacturing Technology, vol. 15, No. 1, pp. 7–14, Feb. 1992.

Primary Examiner—Leo P. Picard
Assistant Examiner—Y. Whang
Attorney, Agent, or Firm—Finnegan, Henderson, Farabow, Garrett & Dunner

[57] ABSTRACT

The multichip module includes a ceramic multilayer substrate, a thick film wiring, a thick film insulator, a thin film multilayer wiring portion and semiconductor chips. The thick film wiring and the thick film insulator are laminated on the ceramic multilayer substrate. The thin film multilayer wiring portion is formed on the thick film insulator. In this thin film multilayer wiring portion, thin film wirings and thin film insulators are alternately laminated. The semiconductor chips are mounted on the thin film insulator of the thin film multilayer wiring portion, and the chips are electrically connected to a plurality of bonding pads made of the thin film wirings of the thin film multilayer wiring portion. A thick film wiring is situated underneath each bonding pad, and the thick film wiring is electrically connected to the thin film wiring in order to serve as a part of the wiring.

16 Claims, 4 Drawing Sheets

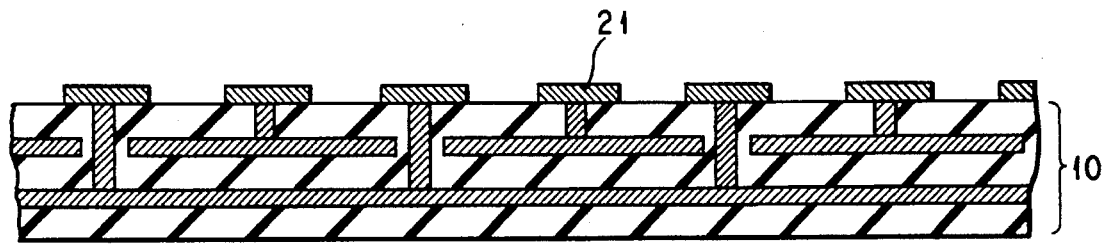
F I G. 4
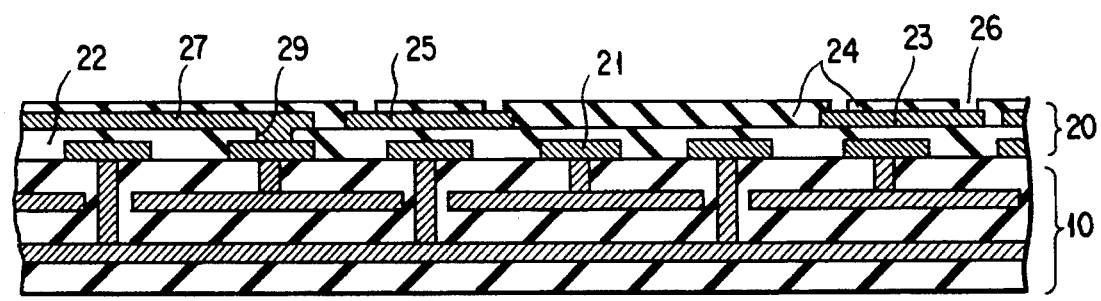
F I G. 5
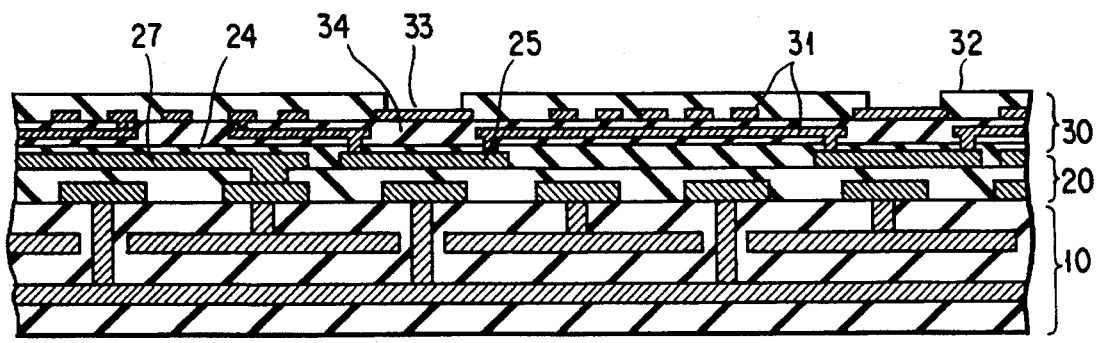
F I G. 6

MCM MANUFACTURED BY USING THIN FILM MULTILEVEL INTERCONNECTION TECHNIQUE

BACKGROUND OF THE INVENTION

1. Field of the Invention

The present invention relates to a semiconductor device manufactured by using a thin film multilevel interconnection technique, and more specifically, to a multichip module (MCM) manufactured by mounting LSI bare chips on a multilayer substrate.

2. Description of the Related Art

Recently, in accordance with an increase in the operation speed of computers and communication equipments, the problem of time delays due to a long distance between LSIs has become more serious. The LSIs manufactured by the method of mounting each one of a number of LSI chips on a printed circuit board in a package state, cannot exhibit a sufficient performance in order to overcome the problem. A solution to the problem has been proposed in the form of a multichip module (MCM) in which a number of LSI bare chips are mounted on a multilayer substrate. MCMs of this type are discussed in, for example, U.S. Pat. No. 4,692,839, "MULTIPLE CHIP INTERCONNECTION SYSTEM AND PACKAGE" Lee et al., IEEE TRANSACTIONS ON COMPONENTS, HYBRIDS AND MANUFACTURING TECHNOLOGY, VOL. 15, NO. 1, February 1992, pages 7–14, "Microcarrier for LSI Chip Used in the HITAC M-880 Processor Group", Inoue et al., and IEEE/CHMT '91 IEMT Symposium, pages 348–355, "CONCURRENT ENGINEERING REALIZATION THROUGH MULTICHIP MODULE VEHICLES: TECHNOLOGY and CAD TOOL EQUIPMENTS", Wyatt.

Multichip modules are generally categorized into the following types according to the type of substrate used, i.e., for example, MCM-L having a resin-made printed circuit board on which bare chips are directly mounted, MCM-C having a ceramic multilayer substrate prepared by printing interconnections respectively on ceramic green sheets, laminating these green sheets and sintering the laminated green sheets, and MCM-D having a thin film multilayer substrate. Of these types, more attention is paid to the MCM-D since it exhibits a highly-accurate electrical characteristic, high wiring density, and the like.

In the case of MCM-D, a base substrate, which serves as a basic material, is required to form a thin film interconnection. By way of the base substrate, a silicon wafer, a metal plate of aluminum or the like, or a ceramic substrate of alumina, aluminum nitride or the like can be used. In the case where a ceramic substrate is used, interconnection is formed inside the base substrate, and the base substrate can also serve as a package, thus increasing its packaging density. Such a structure is particularly categorized as MCM-D/C.

However, the MCM-D and MCM-D/C types, since both are manufactured by the thin film interconnection technique, each include an insulation film which is very thin, and therefore the mechanical strengths of these types are poor. When bonding an LSI chip and a substrate, the insulation layer situated underneath the pad may become cracked due to the shock of bonding. Particularly, when the wiring layer (or interconnection) is located underneath the pad, the portion of the insulation film situated underneath the pad will not be formed flat and thus the portion is inevitably thin. Consequently, in a practical sense, a wiring layer cannot be provided under a pad, and therefore in the case of a multichip module having a number of wiring layers, the size of the substrate, or the number of wiring layers must be increased.

In the meantime, in accordance with an increase in speed of a signal processing and with a demand for an increase in the capacity of a memory, there is greater need for appropriate control of the characteristic impedance of a signal wiring layer. In the case of the MCM-D/C type, a ground plane can be provided in a ceramic multilayer substrate. However, the contraction of ceramic green sheets, which occurs during sintering, may vary from one sheet to another and accordingly, the distance between each green sheet and the signal wiring layer of a thin film wiring portion may vary from one sheet to another. Consequently, the characteristic impedance cannot be properly controlled. In order to avoid this, a ground plane is, in some cases, provided at the lowermost layer of the thin film wiring portion.

FIG. 1 is a cross sectional view showing a structure of an MCM-D/C of the above-described type. As shown in this figure, a ground plane 51 made of a thin film conductor is formed on a base substrate 50 made of ceramic or the like. A thin film insulator 52 is formed on the ground plane 51, and a thin film wiring 53 is formed on the insulator 52. As mentioned above, the thin film wiring 53 is not formed underneath the bonding pad 54. In general, the thin film insulator 52 is formed to be remarkably thin as compared to a width of the thin film wiring 53. For example, for the width of the thin film wiring 53 of 30 µm, the thickness of the thin film insulator 52 is about 5 to 10 µm. Such a fact indicates that the characteristic impedance of the thin film wiring 53 is lowered. For example, in the case of a general thin film wiring 53 having an insulator made of an polyimide or $SiO_2$, the characteristic impedance is about 30 to 40 Ω.

An appropriate value for the characteristic impedance may vary in accordance with the type of semiconductor device used; however it is generally said to be 50 to 75 Ω. In the case where the characteristic impedance is low, the wiring load increases, disabling a high-speed operation. Consequently, a buffer having a high load driving performance must be used, thus increasing its switching noise and power consumption. A solution to this problem has been proposed in the form of a technical idea of increasing the thickness of the thin film insulator 52; however formation of a thick insulation film using the thin film technique, results in a significant increase in production cost and a low yield result, and the technical idea is not completely suitable for preparing a layer which has a sufficient thickness.

As described above, in the conventional multichip module having a thin film multilevel interconnection, the wiring layer may not be situated underneath a bonding pad, and therefore the wiring density is limited. Further, the characteristic impedance of a signal wiring layer is very low especially when the insulation film is made of a thin film insulator, and cannot be properly controlled.

SUMMARY OF THE INVENTION

The present invention has been proposed in consideration of the above circumstances, and an object thereof is to provide a semiconductor device in which wiring layer can be provided underneath a bonding pad, and the density of the wiring layer can be increased.

Another purpose of the invention is to provide a semiconductor device in which the characteristic impedance can be appropriately controlled.

One of the above objects can be achieved by a semiconductor device comprising:

a ceramic base substrate;

a thin film multilayer wiring portion, formed on the ceramic base substrate, in which thin film wirings and thin film insulators are alternately laminated;

a semiconductor chip mounted on the thin film multilayer wiring portion, and electrically connected to a plurality of bonding pads formed on an uppermost layer of the thin film multilayer wiring portion; and a thick film wiring interposed between the thin film insulator located underneath the bonding pads and the ceramic base substrate, and electrically connected to the thin film wiring.

In this semiconductor device, a thick film wiring is formed underneath a bonding pad, and the thick film wiring is electrically connected to a thin film wiring. Therefore, the breakage of the insulator due to bonding damage, and short circuits between conductors due to breakage can be prevented. Consequently, wiring can be provided underneath a bonding pad, thereby increasing the density of the wiring.

Further, another purpose of the invention can be achieved by a semiconductor device comprising:

a ceramic base substrate;

a thick film wiring portion formed on the ceramic base substrate and having a thick film wiring formed underneath an area in which a bonding pad is to be formed, and a ground plane formed underneath an area in which a thin film wiring to be formed;

a first thick film insulator formed on the thick film wiring;

a thin film wiring portion having a first area formed on the first thick film insulator, a thin film insulator formed on the thick film wiring, and a second area on which thin film wirings and thin film insulators are alternately laminated;

bonding pads formed on a thin film insulator of the first area; and at least one semiconductor chip mounted on a thin film insulator of the second area and electrically connected to the bonding pads.

In this semiconductor device, a ground plane made of a thick film wiring is formed on a ceramic base substrate, and the first thick film insulator is formed on the ground plane. Therefore, the characteristic impedance of the thin film wiring can be optimally controlled by varying the thickness of the first thick film insulator.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3 to 6 are cross sectional views illustrating manufacturing steps of a substrate section of the multichip module shown in FIG. 2;

DETAILED DESCRIPTION OF THE PREFERRED EMBODIMENTS

Figure 1:
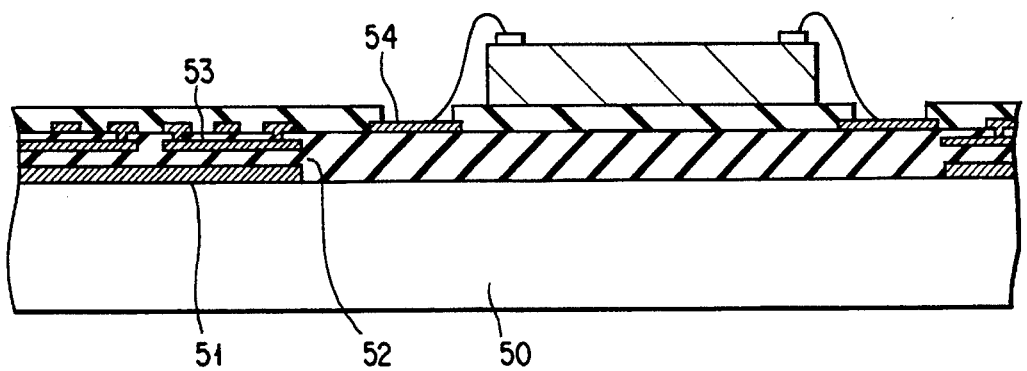
FIG. 1 is a cross sectional view showing a conventional multichip module.
Figure 2:
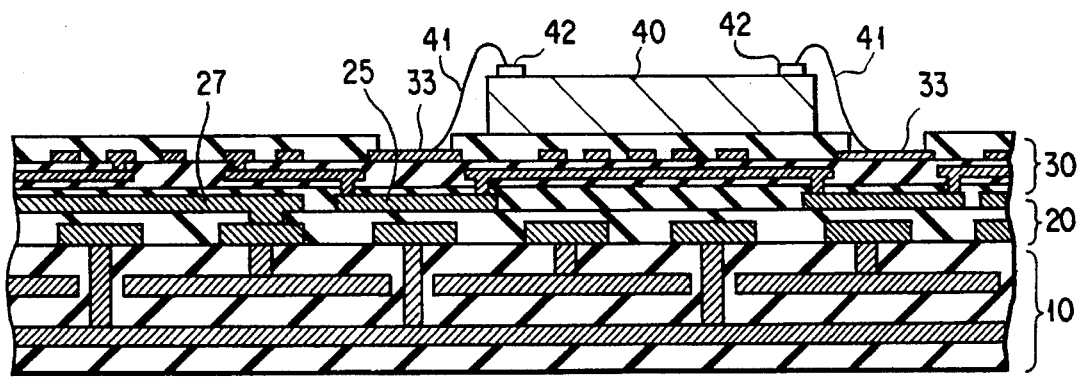
FIG. 2 is a partially cross sectional view showing a multichip module according to the first embodiment of the present invention.

FIG. 2 is a cross sectional view showing a part of a multichip module according to the first embodiment of the present invention. The first embodiment provides an example in which a wiring portion provided underneath a bonding pad by a thick film and a ground plane are situated on the same plane. A thick film wiring portion 20 is formed on a ceramic multilayer substrate (ceramic base substrate) 10, and a thin film wiring portion 30 is formed on the wiring portion 20. Further, a semiconductor chip 40 is mounted on the wiring portion 30. Bonding pads 42 of the semiconductor chip 40 and bonding pads 33 of the thin film wiring portion 30 are connected to each other via bonding wires 41. The connection may be made via TAB (tape automated bonding). In the case where TAB performed at a fine pitch is used, single-point bonding is usually performed. Consequently, bonding damage similar to that of the wire bonding occurs. Therefore, the present invention is also effective for the single-point TAB. A thick film wiring 25 is provided underneath the bonding pad 33, and a ground plane 27, made of a thick film, is formed on the same plane as on which the thick film wiring 25 is provided.

Figure 3:
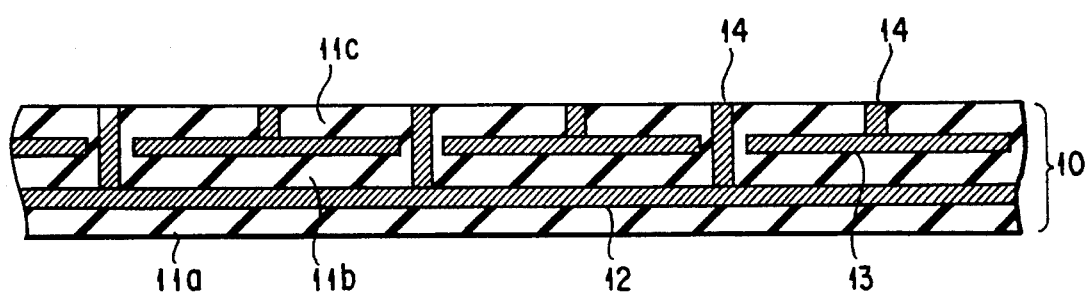
Figure 7:
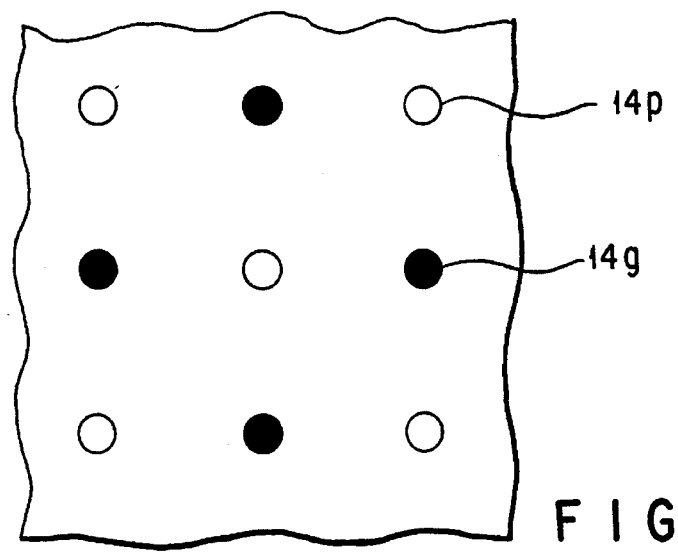
FIG. 7 is a top view schematically showing the substrate section shown in FIG. 3.

Each of FIGS. 3 to 6 is a cross section illustrating a step of manufacturing a part of the ceramic multilayer substrate 10 shown in FIG. 2. As can be seen in FIG. 3, a ceramic multilayer substrate 10 is formed by laminating a surface insulation green sheet 11c on two kinds of ceramic green sheets 11a and 11b on each of which a predetermined wiring pattern is printed using paste of tungsten or molybdenum, and sintering the layer after filling each via hole with the paste (green sheet lamination simultaneous sintering method). The number of layers is not limited to the above, and it may be increased. The ceramic multilayer substrate 10 has a wiring portion which is standardized so that the substrate can be used for various types of modules. Via holes 14 designed to withdraw an internal power supply wiring 12 and an internal ground wiring 13 out on the surface, are arranged regularly as shown in FIG. 7. FIG. 7 is a schematic top view of the device shown in FIG. 3. As can be seen in FIG. 7, via holes 14p (in white) connected to the internal power supply wiring 12 and via holes 14g (in black) connected to the internal ground wiring 13 are regularly arranged. The via holes 14p and 14g serve as connecting terminal electrodes for a wiring portion to be formed later over these electrodes. With such an arrangement that a great number of terminal electrodes are regularly withdrawn, it only suffices if the terminal electrode closest to the overlying wiring portion is selected. Therefore, the designing of the wiring layer can be carried out at a certain degree of freedom. With the standardization of ceramic multilayer substrates, the designing of a ceramic multilayer substrate can be omitted in a renewal designing. The designing time can be shortened, and some of the assembly jigs can be commonly used in the production step, thereby decreasing the production cost.

Next, as shown in FIG. 4, a first thick film wiring 21 is formed at a position corresponding to each via hole on the surface of the ceramic multilayer substrate 10. Each first thick film wiring 21 is provided in order to connect the pattern of the ceramic multilayer substrate 10 with the pattern of the overlying layer, and the wiring 21 have a pattern of a sufficiently large size in consideration of the shrinkage of ceramic due to sintering. In this step, a thick film interconnection technique (thick film printing method) in which thick film conductive paste of a gold-, silver- or copper-based material or the like, is printed and then sintered to form a desired pattern, is used.

In the case where tungsten or molybdenum is used as a wiring material for the ceramic multilayer substrate 10, the sintering of the thick film conductor paste should be carried out in an inert atmosphere such as of a nitrogen gas since these materials are easily oxidized. It is also a possibility that the terminal electrode sections of the top layer of the ceramic multilayer substrate are filled with a precious metal such as platinum or palladium in place of tungsten or molybdenum, so as to prevent the oxidization of tungsten or molybdenum.

Next, as shown in FIG. 5, a first thick film insulator 22 is formed by printing paste of, for example, alumina-based glass ceramics on the first thick film wiring 21, followed by sintering. During the formation, an opening 29, which provides a space for connecting the pattern of the overlying layer formed later with the first thick film wiring 21, is made in the second thick film insulator at a predetermined position. Then, the second thick film wiring 23 is printed, followed by sintering and the second thick film insulator 24 is printed thereon, followed by sintering. An opening 26 is also made in the second thick film insulator 24, in order for connection with an overlying pattern later formed.

The thick film wiring 25 situated under the bonding pad and the ground plane 27 serving as a reference of the characteristic impedance are made out of the second thick film wiring 23. The second thick film insulator 24 is formed to have a such thickness that the impedance of a thin film wiring later formed to overlie thereon can be controlled, with reference to the surface of the ground plane 27. However, in the case where the operation frequency of the module is low and the impedance control of the thin film wiring is not importance, the second thick film insulator 24 is not always necessary. The shape of the pattern of the ground plane 27 used for controlling the impedance may be sheet-like, net-like, stripe-like, island-like or a combination of these.

FIG. 6 is a cross section a manufacture step in which formation of the thin film wiring portion 30 on the thick film wiring portion 20 is completed. The thin film wiring 31 has a multilayer structure of a conductive material mainly consisting of copper having a low electrical resistance, and the thin film insulator 32 is formed of a polyimide-based resin by the well-known thin film multilayer interconnection technique. FIG. 6 illustrates the case where the thin film wiring 31 has two layers, and the number of layers is not limited to this. The thin film wiring 31 is not formed under the bonding pads 33 which is formed by the thin film interconnection technique, and a circuit pattern is formed from the thick film wiring 25. Therefore, the portion of the thin film insulator 34 located on the pad 33 becomes to have a sufficient thickness, reducing the amount of damage while performing a bonding wire. Further, with the second thick film insulators 24 on the thick film wiring 25, the pad 33 and the wiring 25 can be electrically separated by means of the second thick film insulator 24 even in the case where the portion of the thin film insulator 34 located under the bonding pad 33 is cracked, thus maintaining a reliability of the device.

Figure 8:
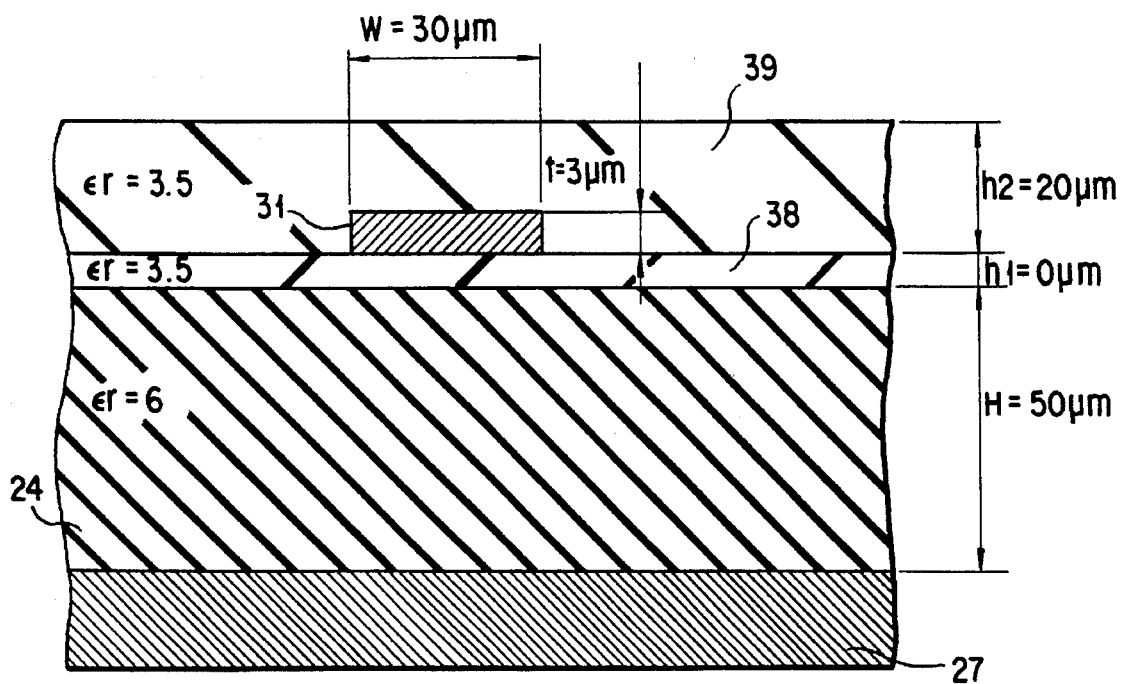
FIG. 8 is an enlarged sectional view showing the relationship between measurements of each wiring and a thickness of an insulation layer, designed as a reference to the explanation of the control of the characteristic impedance.

With the structure shown in FIG. 6, the characteristic impedance of the thin film wiring 31 can be controlled by controlling the thickness of the second thick film insulator 24. Let us take an example of a wiring structure having measurements shown in FIG. 8. As shown in this figure, a thick film insulator 24 having a dielectric constant $\epsilon\gamma=6$ is formed on a thick film ground plane 27, and the first thin film insulator 38 and the second thin film insulator 39, both having a dielectric constant $\gamma\epsilon=3.5$, are formed thereon in this order. Further, a thin film wiring 31 is formed on the first thin film insulator 38, and a second thin film insulator 39 is formed on the thin film wiring 31 and the first thin film insulator 38. The maximum thickness of an insulation layer formed by the thick film interconnection technique is about 50 μm. In the case where the thickness H of the thick film insulator 24 is set to 50 μm and there is no first thin film insulator 38, that is, "$h_1=0$ μm", the characteristic impedance $Z_0$ is calculated to be 40 Ω. Thus, the characteristic impedance can be controlled to be higher than 40 Ω by increasing the thickness $h_1$ of the first thin film insulator 38 or the thickness H of the thick film insulator 24. Meanwhile, in order to reduce the characteristic impedance, it only suffices if the first thin film insulator 38 is formed directly on the thick ground plane 27, expanding the controllability of the characteristic impedance. The degree of freedom in designing increases, enabling improvement of the characteristics of the system as a whole.

Figure 9:
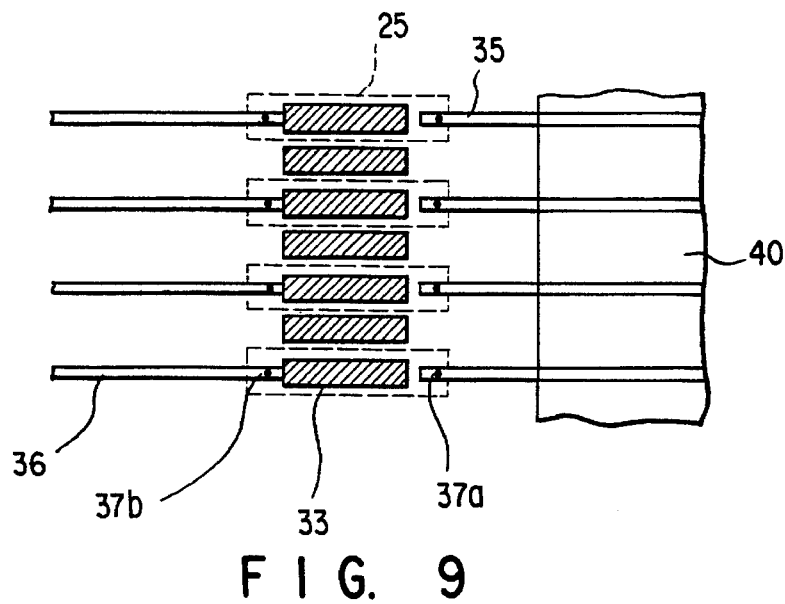
FIG. 9 is a partial see-through diagram showing a multichip module according to the first embodiment.

FIG. 9 is a partial see-through view of the multichip module according to the present embodiment, from the top, and illustrates a portion of a semiconductor chip 40 and a region of the wiring under the bonding pad. The thick film wiring 35 extends under the semiconductor chip 40 via a thin film insulator which is not shown in the figure, and is connected to one end of the thick film wiring 25 provided under the bonding pad 33 through a via hole 37a. The other end of the thick film wiring 25 is connected to the second thin film wiring 36 through a via hole 37b.

According to the thick film interconnection technique, a pattern is formed by screen printing, and therefore the pattern size is inevitably larger than that of a thin film wiring. For example, the wiring width of a thick film is about 100 μm at minimum, whereas that of a thin film is usually 20 to 30 μm (the thin film interconnection technique itself can form a wiring layer having several μm). In the case of narrow-pitch type wire bonding, the pitch of the bonding pad 33 is 125 μm, and in the case of TAB, the pitch is about 80 μm. Therefore, the thick film wiring 25 cannot be formed under all bonding pads (in FIG. 9, the thick film wiring 25 is formed under every other pads). However, a full arrangement of wiring is still possible without providing the wirings under all the bonding pads, and therefore the above-described technique should not raise a serious problem.

Figure 10:
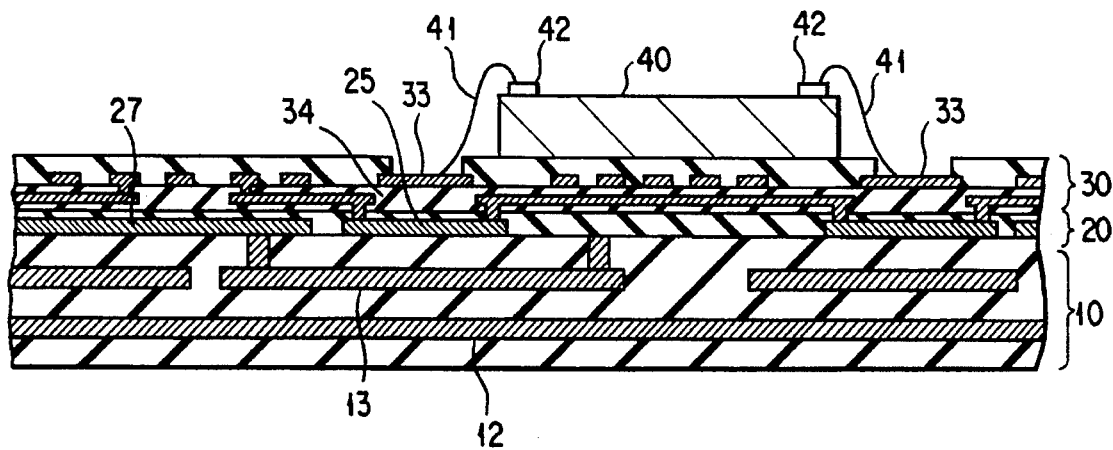
FIG. 10 is a partially cross sectional showing a multichip module according to the second embodiment.

FIG. 10 is a cross section of a multichip module according to the second embodiment of the present invention. FIG. 2 illustrates the case as an example in which the thick film wiring portion 20 consists of two thick film wirings 21 and 23. In contrast, FIG. 10 illustrates an example in which a thick film wiring portion consists of one layer. In the case where the ceramic multilayer substrate 10 is not standardized to be used commonly for various modules, the inner power supply wiring 12 and the inner ground wiring 13, which correspond to each of the various modules, can be freely used. Therefore, the thick film wiring 25 and the ground plane 27 can be formed directly on the surface of the ceramic multilayer substrate 10. The rest of the structure other than described above is the same as that of the first embodiment shown in FIG. 2, and therefore the same elements will be designated by the same reference numerals, and the detailed explanation therefor will be omitted.

The structure of the second embodiment is basically the same as the first one, and therefore substantially the same effect can be obtained.

Although the present invention was described with reference to the above two embodiments, the invention is not limited to these, but can be remodeled into various version as long as the essence of the invention remains.

As described, according to the present invention, wiring layer is formed under a bonding pad by the thick film interconnection technique, and therefore short circuits, which may occur between the bonding pad and the wiring layer formed under the pad, can be prevented. Consequently, the wiring density can be increased without deteriorating the yield of the products. Further, the characteristic impedance can be controlled simply by summation of the thickness of the thick film insulator and that of the thin film wiring with reference to the surface of the ground pattern made of a thick film wiring. Therefore, the degree of freedom of the control can be increased, enabling to obtain the optimal characteristic impedance. Moreover, the number of thin films, the manufacture step thereof is relatively complicated, is decreased, and in stead, thick films, which are relatively easy to manufacture, are used, thereby reducing the production cost.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
   a ceramic base substrate;
   a thick film wiring portion formed on the ceramic base substrate and including a thick film wiring layer and a thick film insulating layer;
   a thin film multilayered wiring portion formed on the thick film wiring portion and including a first region in which thin film wiring layers and thin film insulating layers are alternately stacked upon each other, and a second region in which a plurality of thin film insulating layers are stacked upon one another, at least one of the thin film wiring layers of the first region of the thin film multilayer wiring portion being electrically connected to at least one of the thin film wiring layers of the thin film multilayered wiring portion by way of a part of the thick film wiring layers located under the second region;
   a semiconductor chip mounted on the first region of the thin film multilayered wiring portion and and having a plurality of first bonding pads;
   a plurality of second bonding pads formed on the second region of the thin film multilayered wiring portion; and
   a connection wiring for electrically connecting the first bonding pads to the second bonding pads, said connection wiring having one end which is pressed and coupled to the first bonding pads and another end which is pressed and coupled to the second bonding pads.

2. A semiconductor device according to claim 1, wherein said ceramic base substrate has a multilayer structure including at least a ground wiring and a power supply wiring.

3. A semiconductor device according to claim 2, wherein said ceramic base substrate has a leader electrode of said ground wiring and a leader electrode of said power supply wiring, at a wiring region on a mounting surface side of said semiconductor chip.

4. A semiconductor device according to claim 3, further comprising: a ground plane formed from said thick film wiring, on a same plane as said thick film wiring, and electrically connected to the leader electrode of said ground wiring.

5. A semiconductor device according to claim 4, further comprising a thick film insulator disposed between said ground plane and said thin film multilayer wiring portion.

6. A semiconductor device according to claim 4, wherein one end of said thick film wiring is electrically connected to said thin film wiring located under said semiconductor chip, and an other end of said thick film wiring is electrically connected to said thin film wiring located above said ground plane.

7. A semiconductor device according to claim 1, further comprising:
   a first thick film insulator disposed between said thick film wiring and said ceramic base substrate; and
   a second thick film insulator disposed between said thick film wiring and said thin film insulator located under said at least one of bonding pads.

8. A semiconductor device comprising:
   a multilayered ceramic base substrate including at least a ground wiring layer and a power supply wiring layer;
   a thick film wiring portion formed on the ceramic base substrate and having a thick film wiring layer and a ground plane, said ground plane being electrically connected to the ground wiring layer;
   a first thick film insulating layer formed on the thick film wiring portion;
   a thin film multilayered wiring portion formed on the thick film wiring portion and including a first region in which thin film wiring layers and thin film insulating layers are alternately stacked upon each other and a second region in which a plurality of thin film insulating layers are stacked upon one another, at least one of the thin film wiring layers of the first region of the thin film multilayered wiring portion being electrically connected to at least one of the thin film wiring layers of the thin film multilayered wiring portion by way of a part of the thick film wiring layers located under the second region;
   semiconductor chip mounted on the thin film multilayered wiring portion and having a plurality of first bonding pads;
   a plurality of second bonding pads formed on the second region of the thin film multilayered wiring portion; and
   a connection wiring for electrically connecting the first bonding pads to the second bonding pads, said connection wiring having one end which is pressed and coupled to the first bonding pads and another end which is pressed and coupled to the second bonding pads.

9. A semiconductor device according to claim 8, wherein said ceramic base substrate has a leader electrode of said ground wiring and a leader electrode of said power supply wiring, at a wiring region located under said thick film wiring portion.

10. A semiconductor device according to claim 9, wherein said leader electrode of said ground wiring is electrically connected to said ground plane.

11. A semiconductor device according to claim 8, wherein said thick film wiring is electrically connected to said thin film wirings of said thin film wiring portion.

12. A semiconductor device according to claim 8, wherein one end of said thick film wiring is electrically connected to said thin film wiring located under said semiconductor chip, and an other end of said thick film wiring is electrically connected to said thin film wiring located on said ground plane.

13. A semiconductor device according to claim 8, further comprising a second thick film insulator disposed between said thick film wiring and said thin film insulators.

14. A semiconductor device comprising:
- a ceramic multilayered substrate formed by a green sheet lamination simultaneous sintering method, said ceramic multilayered substrate including at least a ground wiring layer and a power supply wiring layer;
- a ground plane and a thick film wiring layer which are formed on the ceramic multilayered substrate by a thick film printing method, said ground plane being electrically connected to the ground wiring layer;
- a thick film insulating layer formed on both the ground plane and the thick film wiring layer by a thick film printing method;
- a thin film multilayered wiring portion formed on the thick film wiring portion and including a first region in which thin film wiring layers and thin film insulating layers are alternately stacked upon each other and a second region in which a plurality of thin film insulating layers are stacked upon one another, at least one of the thin film wiring layers of the first region of the thin film multilayered wiring portion being electrically connected to at least one of the thin film wiring layers of the thin film multilayered wiring portion by way of a part of the thick film wiring layers located under the second region;
- a semiconductor chip mounted on the first region of the thin film multilayered wiring portion and having a plurality of first bonding pads;
- a plurality of second bonding pads formed on the second region of the thin film multilayered wiring portion; and
- a connection wiring for electrically connecting the first bonding pads to the second bonding pads, said connection wiring having one end which is pressed and coupled to the first bonding pads and another end which is pressed and coupled to the second bonding pads.

15. A semiconductor device according to claim 14, wherein said ceramic multilayer substrate has a multilayer structure including at least a ground wiring and a power supply wiring.

16. A semiconductor device according to claim 15, further comprising at least a leader electrode of said ground wiring layer and a leader electrode of said power supply wiring layer, provided in a wiring region of a mounting surface side of said semiconductor chips in said ceramic multilayer substrate.

* * * * *